US006678854B1

(12) United States Patent
Irvin (10) Patent No.: US 6,678,854 B1
(45) Date of Patent: Jan. 13, 2004

(54) METHODS AND SYSTEMS FOR PROVIDING A SECOND DATA SIGNAL ON A FRAME OF BITS INCLUDING A FIRST DATA SIGNAL AND AN ERROR-CORRECTING CODE

(75) Inventor: David Rand Irvin, Raleigh, NC (US)

(73) Assignee: Ericsson, Inc., Research Triangle Park, NC (US)

(*) Notice: Subject to any disclaimer, the term of this patent is extended or adjusted under 35 U.S.C. 154(b) by 0 days.

(21) Appl. No.: 09/417,243

(22) Filed: Oct. 12, 1999

(65) Prior Publication Data

(65)

(51) Int. Cl.[7] .................. H03M 13/00; G06F 11/00; H04Q 7/20
(52) U.S. Cl. .............. 714/752; 714/704; 370/333
(58) Field of Search ............... 714/752, 704; 370/333

(56) References Cited

U.S. PATENT DOCUMENTS

| | | | |
|---|---|---|---|
| 4,823,345 A | | 4/1989 | Daniel et al. ............ 371/37 |
| 4,914,660 A | * | 4/1990 | Hirose ................. 714/782 |
| 5,014,273 A | * | 5/1991 | Gagliardo et al. ........ 714/758 |
| 5,056,089 A | * | 10/1991 | Furuta et al. ............ 714/703 |
| 5,142,539 A | | 8/1992 | Dahlin et al. ........... 371/37.1 |
| 5,396,239 A | * | 3/1995 | McMahon et al. ........ 341/58 |
| 5,550,809 A | | 8/1996 | Bottomley et al. ....... 370/18 |
| 5,689,568 A | | 11/1997 | Laborde ............... 380/49 |
| 5,862,160 A | | 1/1999 | Irvin et al. ............ 371/53 |
| 5,903,606 A | * | 5/1999 | Okayama .............. 375/228 |
| 6,052,812 A | * | 4/2000 | Chen et al. ............ 714/751 |
| 6,144,324 A | * | 11/2000 | Sasaki ................ 341/94 |
| 6,430,721 B2 | * | 8/2002 | Kajala et al. .......... 714/752 |

OTHER PUBLICATIONS

Boudreau, P.E., et al., *Performance of a cyclic redundancy check and its interaction with a data scrambler*, IBM J. Res. Develop., vol. 38, No. 6, pp. 651–658 (Nov. 1994).

Irvin, D.R., *Preserving the integrity of cyclic-redundancy checks when protected text is intentionally altered*, IBM J. Res. Develop., Vol 33, No, 6, pp. 618–626 (Nov. 1989).

* cited by examiner

Primary Examiner—Phung M. Chung
Assistant Examiner—Esaw Abraham
(74) Attorney, Agent, or Firm—Myers Bigel Sibley & Sajovec (57) ABSTRACT

A method for transmitting first and second data signals can include providing a frame of bits including a first plurality of bits defining the first data signal and a second plurality of bits defining an error-correcting code having capacity to correct N bit errors in the frame. At least one bit position but less than N bit positions of the frame can be associated with a message type of the second data signal, and the associated bit positions of the frame can be inverted to encode the message type in the frame of bits. The encoded frame of bits can then be transmitted. In addition, the encoded frame of bits can be received, and error correction can be performed on the received encoded frame of bits using the error-correcting code to decode the associated bit positions to recreate the first plurality of bits defining the first data signal. Moreover, the message type can be determined based on the decoded associated bit positions to receive the second data signal including the message type. Related systems are also discussed.

21 Claims, 5 Drawing Sheets

METHODS AND SYSTEMS FOR PROVIDING A SECOND DATA SIGNAL ON A FRAME OF BITS INCLUDING A FIRST DATA SIGNAL AND AN ERROR-CORRECTING CODE

FIELD OF THE INVENTION

The present invention relates to communication systems and methods, and more particularly to systems and methods for providing primary and secondary data signals.

BACKGROUND OF THE INVENTION

Digital communication systems can enable the exchange of bit-encoded information among various electronic devices or nodes. The functions used to accomplish this purpose can be divided into seven groups, each group corresponding to one of the layers of a seven-layer data-communications protocol model adopted by the international standards community, as described in Section 3.1 of Data Networks by Bertsekas and Gallagher (Prentice-Hall, 1987).

The lowest layer of this model, known as the physical layer, encompasses methods and apparatus used to move bits from a source to a destination. These methods and apparatus can include transmission wires, connectors, and antennas; modulators and demodulators; and the associated electronics and components used to communicate a bit stream between adjacent nodes in a communication network by means of fiber optics, coaxial cables, parallel conductor transmission lines, wireless radio links, or combinations thereof. In this context, the resulting bitstream can be referred to as a physical channel.

Once a physical channel is established and a bitstream can be communicated between network nodes, the bits provided by the bitstream can be organized for the benefit of a user or a plurality of users, thereby providing these users with logical channels derived from the raw bit-moving capacity of the physical channel. The functions used to accomplish this organization are generally encompassed by the higher layers of the seven-layer protocol model mentioned above.

For example, the North American telephone network includes a transmission method and format known as T1-rate service. This service moves bits between network nodes at the rate of 1.536 million bits per second (Mbps). In one use, the full capacity of the T1 physical channel can be employed to provide a single broadband channel for the benefit of a single user, for example, to connect a first high-capacity computer server in a first city to a second high-capacity server in a second city. In a different situation, the capacity of the T1-rate physical channel can be subdivided by multiplexing to provide twenty-four channels each having a transmission capacity of 64,000 bits per second (64 Kbps). Through functions encompassed by the higher layers of the protocol model, each of these 64 Kbps channels can be configured to support a different digital conversation or application, thereby subdividing the physical channel into a plurality of logical channels.

Error-detection techniques may be used to provide some degree of protection against transmission errors. Such errors may arise from the coupling of external disturbances (noise) into the physical channel, and may have the undesired effect of altering the logical state of bits transmitted on the physical channel, thereby altering the logical state of bits delivered by one or more of the logical channels. Error-detection may be provided by data-link-control (DLC) functions encompassed by the higher layers of the protocol model.

Under the operation of a standard DLC, a plurality of bits to be communicated can be collected and grouped into a data packet (or data signal). A packet header appended to the beginning of the frame may include flag, address, and control fields used to enable and assist the operation of other network functions. A packet trailer appended to the end of the frame may include flag bits and error-detection code bits (parity bits). Together, the header, packet, and trailer can be referred to as a frame. The purpose of the error-detection code bits included in the frame is to provide a means of detecting the presence of bit errors introduced into the frame during its transit across the physical channel.

One particular method of generating and processing error-detection code bits is the cyclic redundancy check (CRC), the operation of which can be described as a series of multiplication and division operations among polynomials having modulo-2 coefficients in recognition of their representation of digital bits. In this representation, the contents of a partial frame (i.e., the frame excluding its header flag and its trailer) can be thought of as an N-degree polynomial, where N is the number of bits in the partial frame. This polynomial is divided by a second polynomial known as the CRC generator polynomial. On completion of the division, the resulting remainder is incorporated into the packet trailer as the error-detection code bits, and the frame is passed to the physical channel for transmission.

Upon receipt of the frame, the receiving node again computes the polynomial division of the received bits, and compares the resulting remainder with the received remainder. Transmission errors are indicated by any disagreement between the remainder as conveyed by the received frame and the remainder as re-computed by the receiver.

The polynomial model as well as the limitations and capabilities inherent in CRCs derived from various generator polynomials in commercial use are described more fully by Boudreau, Bergman, and Irvin, in "Performance Of A Cyclic Redundancy Check And Its Interaction With A Data Scrambler" (IBM Journal of Research and Development, Vol. 38, No. 6, November 1994, pp. 651–658). From mathematical results laid out in this paper, it can be shown that current error-detection schemes may provide excess error-detection capacity.

Excess error-detection capacity may arise from practical design constraints. For example, the number of error-detection code bits provided by a commercially useful CRC may have a granularity based on an integral multiple of eight, due to the byte-oriented nature of conventional digital communication apparatus. Moreover, in commercial usage, most useful CRC generator polynomials are chosen from a relatively small set of accepted industry standards that provide either eight, sixteen, or thirty-two error-detection code bits. For this reason, a system architect may select a 32-bit CRC to provide an abundance of capacity relative to the task at hand, rather than select a 16-bit CRC which might provide insufficient error-detection capacity. The inflexibility of this granularity may thus lead to a wasteful excess of error-detection capacity.

In addition, one link of a communications channel may require a higher level of error-detection than another link. In a cellular radiotelephone communications system, for example, a frame of data may be transmitted from a first mobile terminal to a first base station over a first radio link, from the first base station to a second base station over one or more wired links, and from the second base station to a second mobile terminal over a second radio link wherein the radio links provide a less reliable transmission medium than the wired links between the two base stations. A single error-detection code, such as a CRC code, can thus be used for a frame transmitted over the different links to provide a level of error-detection sufficient to accommodate the less reliable radio links. This level of error-detection, however, may provide excess error-detection capacity with respect to the wired links.

Excess error-detection capacity may have important commercial considerations that follow from the nature of the DLC of which the error-detection is part. In addition to its error-detection functions, the DLC may control access to the physical transmission medium, and, in this sense, may impose a logical channel upon the physical channel. In doing so, the DLC may also impose limits inherent in its predetermined frame structure, and, in particular, may constrain transmission efficiency over more reliable links by requiring excess error-detection capacity in its format.

The DLC's use of excess error-detection capacity may have adverse economic consequences to the end-user of the communication system. If the end-user has a need for a small amount of additional transmission capacity, for example, to implement a secondary channel for the purpose of carrying network-management information or for extending the reach of an exhausted control field, that user may be required to procure additional physical-channel bandwidth from a common carrier. This procurement may incur a penalty in complexity and in operating cost. Such problems may become particularly acute when the physical channel is provided by a wireless communication network, such as a cellular or satellite network, where the limitations imposed by regulatory agencies to conserve the finite electromagnetic spectrum may make the purchase of additional transmission capacity prohibitively expensive.

Thus, there is a need to enable the DLC to recapture excess error-detection capacity and apply this recaptured capacity toward providing a secondary logical channel over which the end-user or the common carrier itself may communicate incidental information without increasing the bandwidth needed to accommodate the physical channel. In this way, spectral resources in a wireless communication system may be conserved, and wasteful expenditures may be reduced in a wireline communication system.

A method for combining information from two sources using excess error-detection capacity and for separating the combined information after transmission over one physical channel is discussed, for example, in U.S. Pat. No. 5,862,160 to David R. Irvin et al. entitled "Secondary Channel For Communication Networks". The Irvin et al. '160 patent is assigned to the assignee of the present application, and shares a common inventor with the present application. In addition, the disclosure of the Irvin et al. patent is incorporated herein in its entirety by reference.

In the Irvin et al. '160 patent, a specified data mask which represents a specified data input pattern is exclusively ORed (XORed) with a data stream including an error-detection code before transmission to induce an error-detection code violation. At the receiving end, if the calculated and received error-detection code bits differ, at least one specified mask is XORed with the received data stream. In general, the receiving system contains a list of masks that are the same as those which are in the transmitting system. The received error-detection code bits are again compared to the calculated error-detection code bits for the XORed product of the data frame and mask (XOR product).

The process is repeated for every specified mask stored within the receiver. If the received error-detection code bits differ from the computed error-detection code bits, the receiving system assumes that a transmission error has occurred. If the received error-detection code bits agree with the computed error-detection code bits, then the receiving system concludes that the input data frame has been recreated. The reason for this conclusion is that the XORed product of the data frame and the mask is the original data frame. Moreover, the mask used to recreate the original data frame is the same as the mask used at the transmission end of the communication link.

The method from the disclosure of the Irvin et al. '160 patent, however, may be unable to decode either the original data frame or data originated from the second source if a transmission/reception error occurs.

SUMMARY OF THE INVENTION

It is therefore an object of the present invention to provide improved methods and systems that encode a second data signal on a frame of bits including a first data signal.

It is another object of the present invention to provide methods and systems that encode a second data signal on a frame of bits including a first data signal wherein the first and second data signals can be received if errors occur during transmission.

These and other objects may be provided according to the present invention by including an error-correcting code in the frame of bits wherein the error-correcting code has a capacity to detect and correct a greater number of bit errors than are expected to be induced during transmission/reception over a communications channel. The excess error correcting capacity can thus be used to encode a second data signal on the frame of bits including the first data signal and the error-correcting code so that the first and second data signals can be successfully received even when an error is induced during transmission/reception.

In particular, a method according to the present invention can include providing a frame of bits including a first plurality of bits defining the first data signal and a second plurality of bits defining an error-correcting code having capacity to correct N bit errors in the frame, and associating at least one bit position but less than N bit positions of the frame with a message type of the second data signal. The associated bit positions of the frame are inverted to encode the message type in the frame of bits, and the encoded frame of bits is transmitted. The method can also include receiving the encoded frame of bits, and performing error correction on the received encoded frame of bits using the error-correcting code to decode the associated bit positions to recreate the first plurality of bits defining the first data signal. The message type can also be determined based on the decoded associated bit positions to receive the second data signal including the message type.

Moreover, the step of associating can include associating a plurality of combinations of at least one bit position with a respective plurality of message types of the second data signal. One of the plurality of associated combinations of at least one bit position representing one of the message types can be selected, and the step of inverting the associated bit positions can include inverting the selected associated combination of at least one bit position. For example, four message types can be provided such that message type 0 represents the bit combination "00", the message type 1 represents the bit combination "01", the message type 2 represents the bit combination "10", and the message type 3 represents the bit combination "11". Furthermore, a frame of bits can include 100 bits such that bit positions 75 and 80 are associated with message type 0 ("00"), bit positions 76 and 81 are associated with message type 1 ("01"), bit positions 77 and 82 are associated with message type 2 ("10"), and bit positions 78 and 83 are associated with message type 3 ("11").

According to this example, message type 0 can be transmitted by inverting bit positions 75 and 80, message type 1 can be transmitted by inverting frame bit positions 76 and 81, message type 2 can be transmitted by inverting frame bit positions 77 and 82, and message type 3 can be transmitted by inverting frame bit positions 78 and 83. After receiving the encoded frame of bits including the inverted associated bit positions, error correction using the error-correcting code can be performed to decode the bit positions associated with the transmitted message type and to recreate the frame of bits as it existed prior to inverting the bit positions associated with the message type thereby recreating the first data signal. The step of performing error correction can also be used to determine the message type associated with the inverted bits to receive the second data signal.

In addition, the step of transmitting the encoded frame of bits can include transmitting the encoded frame of bits over a wired communications link, and the step of receiving the encoded frame of bits can include receiving the encoded frame of bits over the wired communications link. Moreover, the step of providing the frame of bits can include receiving the frame of bits at the first node over a wireless communication link, and the step of transmitting the encoded frame of bits can include transmitting the encoded frame of bits over a wired communications link. The error correcting code can thus be selected to provide an acceptable level of error-correcting capacity with respect to a bit error rate expected over the wireless communications link, and to provide an excess error-correcting capacity with respect to a lower bit error rate expected over the wired communication link.

The step of associating at least one bit position but less than N bit positions of the frame with a message type can include associating a plurality of spaced apart bit positions with the message type. A larger number of bit positions associated with a message type reduces the possibility that a random bit error incurred during transmission/reception can be misinterpreted as the message type. By spacing apart bit positions associated with a message type, the likelihood that a burst error occurring over the communications channel is misinterpreted as the message type can be reduced.

A method according to the present invention can also include determining a bit error rate for the communications channel and suppressing transmission of the second data signal when the determined bit error rate exceeds a predetermined threshold. In particular, a forward bit error rate (BER) can be determined for information received at the second node from the first node, and transmission of the second data signal can be suppressed from the first node to the second node when the bit error rate exceeds a predetermined threshold. The full error-correcting capacity of the error-correcting code can be used to correct transmission/reception errors incurred over a communications channel by suppressing forward transmission of the second data signal.

Alternately, it may be relatively accurate to assume symmetrical forward and reverse bit error rates when determining whether to suppress transmission of the second data signal. A method according to the present invention can thus include determining a bit error rate (BER) for information received at the first node from the second node, and suppressing transmission of the second data signal from the first node to the second node when the bit error rate exceeds a predetermined threshold. Accordingly, decisions regarding suppressing transmission of the second data signal can be made at the first node without knowledge of bit error rates determined at the second node.

Because methods according to the present invention rely on excess capacity of an error-correcting code to encode the second data signal, bit errors incurred during transmission/reception over a communications channel can be corrected while receiving both the first and second data signals. In particular, the step of receiving the frame of bits can include receiving the frame of bits with the intentionally inverted associated bit positions and with an additional unintentionally inverted bit position (such as a transmission/reception error incurred over a communications channel), and the step of performing error correction can further include correcting the additional unintentionally inverted bit position.

Methods and systems according to the present invention can thus allow encoding a second data signal on a frame of bits including a first data signal and an error-correcting code using excess capacity of the error correcting code. Methods and systems according to the present invention can also provide reception of both the first and second data signals even if a bit error is incurred during transmission/reception over a communications channel.

DETAILED DESCRIPTION

The present invention will now be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout. As will be appreciated by one of skill in the art, the present invention may be embodied as methods or devices. Accordingly, the present invention may take the form of a hardware embodiment, a software embodiment or an embodiment combining software and hardware aspects.

Figure 1A:
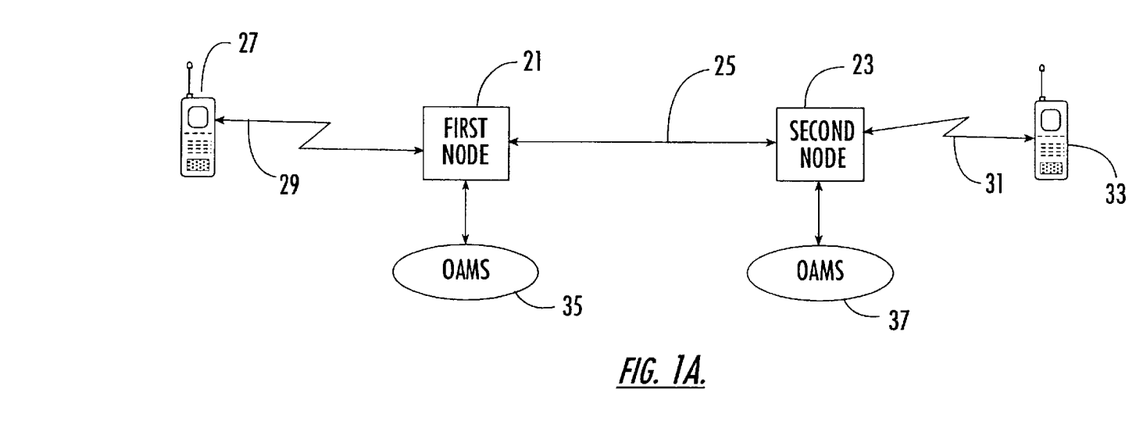
FIGS. 1A, 1B, and 1C are block diagrams of communications systems according to the present invention.

As shown in FIG. 1A, a communications system according to the present invention can include a first communications node 21 (such as a first cellular radiotelephone base station) and a second communications node 23 (such as a second radiotelephone base station) coupled through a communications channel 25. In the example of a cellular communications system, a first radiotelephone 27 can transmit information to the first communications node 21 (radiotelephone base station) over a first wireless link 29 for retransmission over the communications channel 25 to the second communications node 23 (second radiotelephone base station) for retransmission over a second wireless link 31 to a second radiotelephone 33. The communications channel 25 can be provided, for example, over a wired link such as a T1 link, over a wireless link such as a microwave link, over an optical link such as a fiber optic link, over a radio frequency link, over an infrared link, over a magnetic link, or over a mixed link. Moreover, the communications channel 25 may include an intermediate node(s) such as a mobile telephone switching station.

As further shown in FIG. 1A, first and second system management nodes 35 and 37 may be respectively coupled to the first and second communications nodes 21 and 23. These system management nodes may be used to provide operations, administration, management, and supervision (OAMS) functions. While the system management nodes 35 and 37 are illustrated as being separate from the respective communications nodes 21 and 23 for ease of illustration, it will be understood that the system management nodes may be provided as components of the respective communications nodes. In providing OAMS functions, it may be useful to transmit information between the system management nodes 35 and 37 through the first and second communications nodes 21 and 23 and the communications channel 25. While transmission from the mobile terminal 27 through the communications nodes 21 and 23 to the mobile terminal 33 is discussed herein, systems and methods of the present invention can also provide transmission from the mobile terminal 33 through the communications nodes 23 and 21 to the mobile terminal 27. Similarly, information can be transmitted in either direction between the system management nodes 35 and 37 through the communications nodes 21 and 23.

Figure 1B:
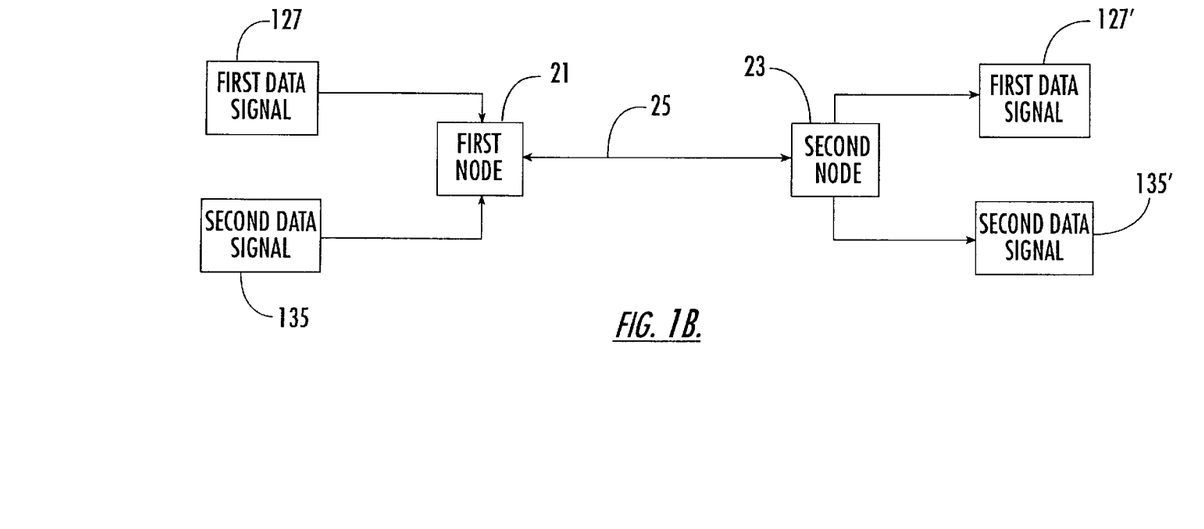

More generally, the link between the first and second mobile terminals 27 and 33 can be referred to as a primary link used to transmit first data signals, and the link between the first and second system management nodes 35 and 37 can be referred to as a secondary link used to transmit second data signals as will now be described with reference to FIG. 1B. As shown in FIG. 1B, a first data signal 127 from the first mobile terminal can be combined with a second data signal 135 from the first system management node 35 at the first node 21 for transmission over the common communications channel 25. The received first data signal 127' can then be separated from the received second data signal 135' at the second node 23 with the received first data signal 127' being provided to the second mobile terminal 33 and the received second data signal 135' being provided to the second system management node 37. While the present invention is discussed herein in the context of a radiotelephone communications system, the methods and systems of the present invention can be used any time two different data signals are transmitted on a common communications channel. Methods and systems according to the present invention, for example, can also be used in wired communications networks, such as public switched telephone networks or computer networks.

Figure 1C:
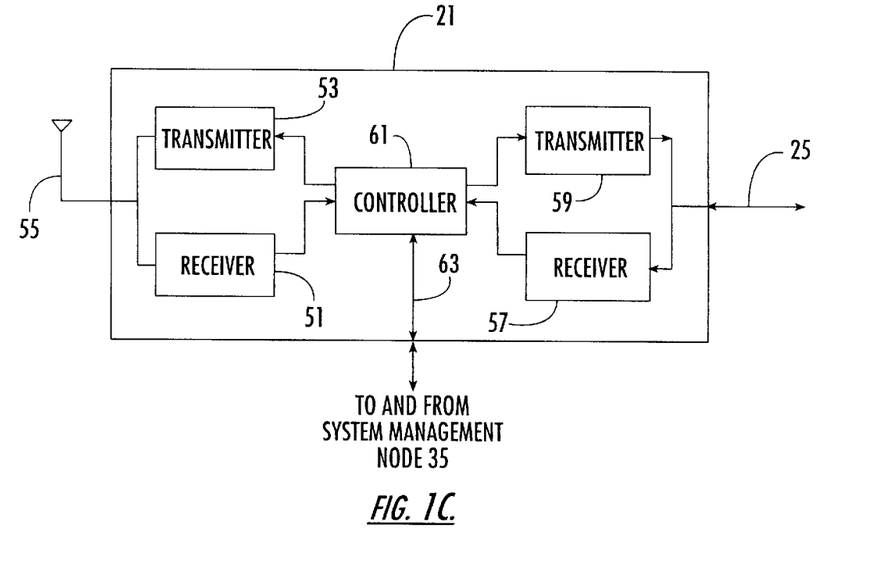

A more detailed block diagram of the first communications node 21 is provided in FIG. 1C. As shown, the first communications node 21 can include a first receiver 51, and a first transmitter 53 that provide reception and transmission over the wireless link 29 using antenna 55. In addition, the first communications node 21 can also include a second receiver 57 and a second transmitter 59 that provide reception and transmission over the communications channel 25. Operations of the first communications node 21 and the flow of communications therethrough can be managed using the controller 61. Moreover, a bidirectional data link 63 can be provided between the controller 61 and the system management node 35. Alternately, the system management node 35 may be provided as a portion of the controller 61. According to yet another alternative, the bidirectional data link 63 can be defined to include a transmitter and a receiver. As will be understood, the structure illustrated in FIG. 1C can also be used to implement the second communications node 23 with a transmitter and receiver being used to provide transmission and reception through an antenna over the wireless link 31, with a transmitter and receiver being used to provide transmission and reception over the communications link 25, with a controller managing operations thereof, and with a bidirectional data link provided between the controller and the second system management node 37.

Figure 2:
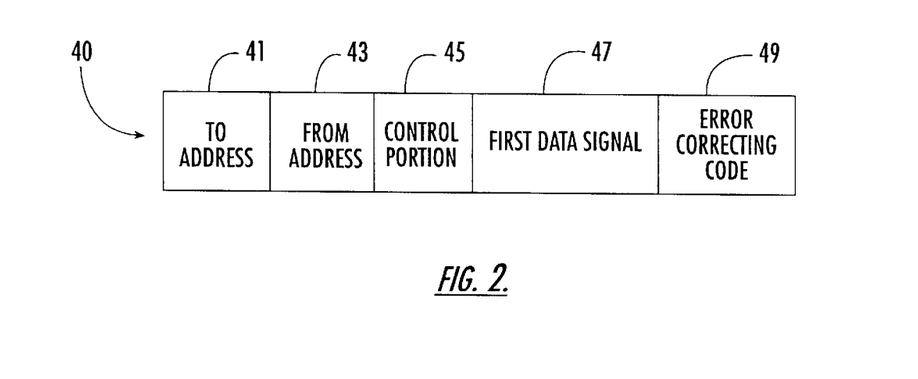
FIG. 2 is a diagram of a frame of bits including a first data signal and an error-correcting code according to the present invention.

An example of a frame of bits used to transmit a first data signal between the first and second mobile terminals is illustrated in FIG. 2. As shown, the frame of bits can be divided into segments of bits to provide a "To Address" 41 identifying the second (receiving) mobile terminal 33, a "From Address" 43 identifying the first (transmitting) mobile terminal 27, a "Control" portion 45, a "First Data Signal" 47, and an "Error-Correcting Code" 49. While each segment is shown as comprising adjacent bits in the frame for ease of illustration, bits of one or more of the segments can be interleaved within and/or across frames, and/or the order of the segments can be rearranged. Moreover, the illustrated segments are provided as examples of segments that can be transmitted according to the present invention while more, fewer, and/or different segments may be used in an actual application.

In particular, the error-correcting code provides a redundancy of information that can be used to detect and correct up to N bit transmission errors in the frame where N is a function of the length of the error-correcting code. In other words, a longer error-correcting code can provide greater redundancy and thus correction of a greater number of bit errors. Error-correcting codes are discussed, for example, in "*Algebraic Coding Theory*" by Elwyn Berlekamp (McGraw-Hill, 1968), and in "*An Introduction to Error-Correcting-Codes*" by Shu Lin (Prentice-Hall, 1970). The disclosures of both of these texts are hereby incorporated herein in their entirety by reference. The error-correcting code can thus be calculated for each frame of bits to protect against bit errors during transmission/reception induced by disturbances in the physical communications medium such as RF noise or fading in an RF environment.

In the radiotelephone communications system in the example of FIG. 1, the length of the error-correcting code may be selected based on a bit error rate (BER) expected over the wireless links 29 and 31. Because a lower bit error rate may be expected over the communications channel 25 between the first and second communications nodes 21 and 23, the length of the error-correcting code (i.e. the redundancy provided by the error-correcting code) may be greater than is necessary to provide reliable communications between the first and second communications nodes 21 and 23. This excess error-correcting capacity can be used to encode a second data signal on the frame of bits used to transmit the first data signal as discussed in greater detail below with reference to the flow charts of FIGS. 3 and 5.

With reference to FIGS. 1A, 1B, and 2, a frame of bits including the "To Address" 41 identifying the receiving mobile terminal 33, the "From Address" 43 identifying the transmitting mobile terminal 27, the "Control" portion 45, the "First Data Signal" 47, and the "Error-Correcting Code"

49 is generated by the transmitting mobile terminal 27 and transmitted over the wireless link 29 to the first communications node 21. The error-correcting code is selected to provide a sufficient error-correcting capacity with respect to a bit error rate expected over the wireless communications links 29 and 31. The error-correcting code may thus provide an excess capacity with respect to a lower bit error rate expected over the more reliable communications channel 25 between the first and second nodes 21 and 23.

Figure 3:
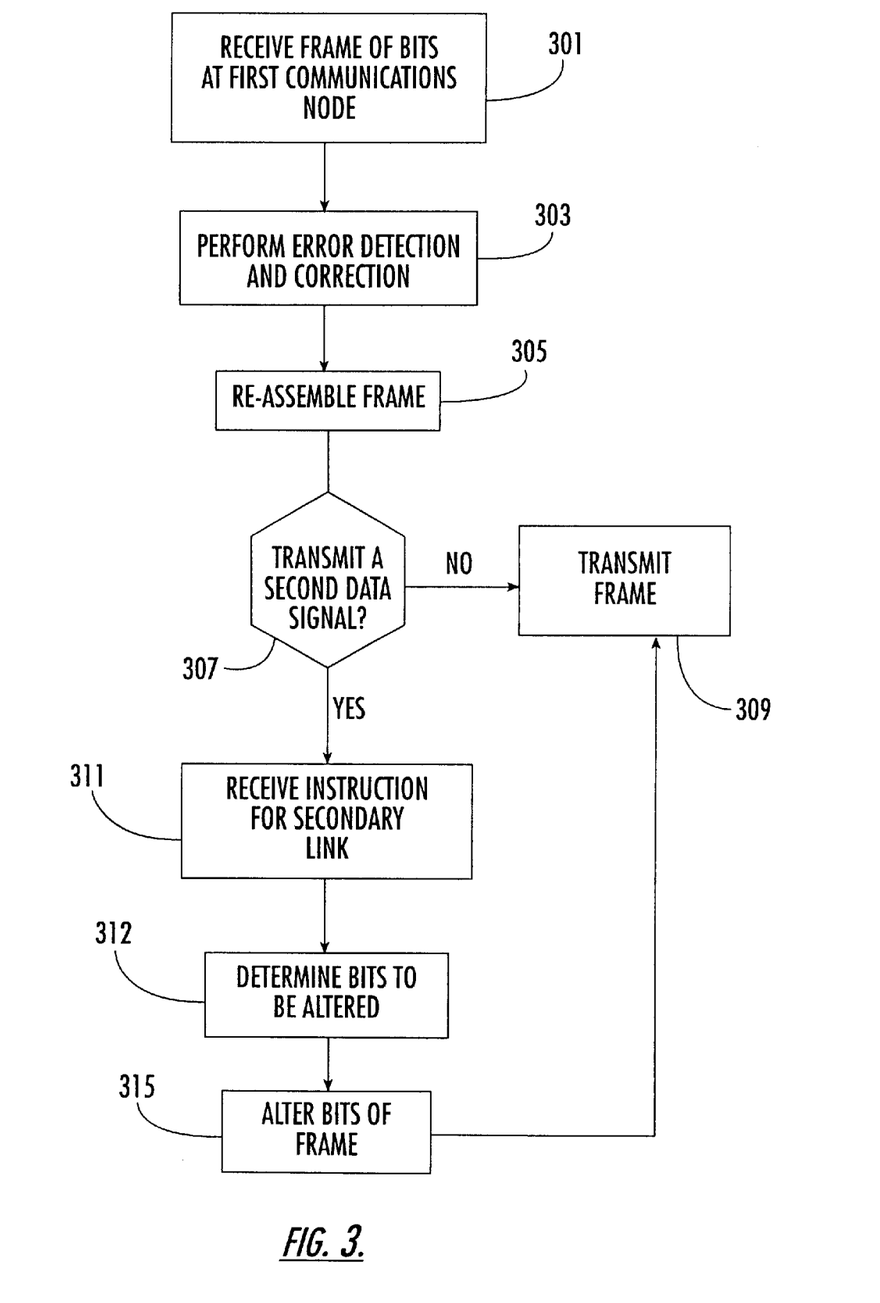
FIG. 3 is a flow diagram illustrating operations of a transmitting communications node according to the present invention.
Figure 5:
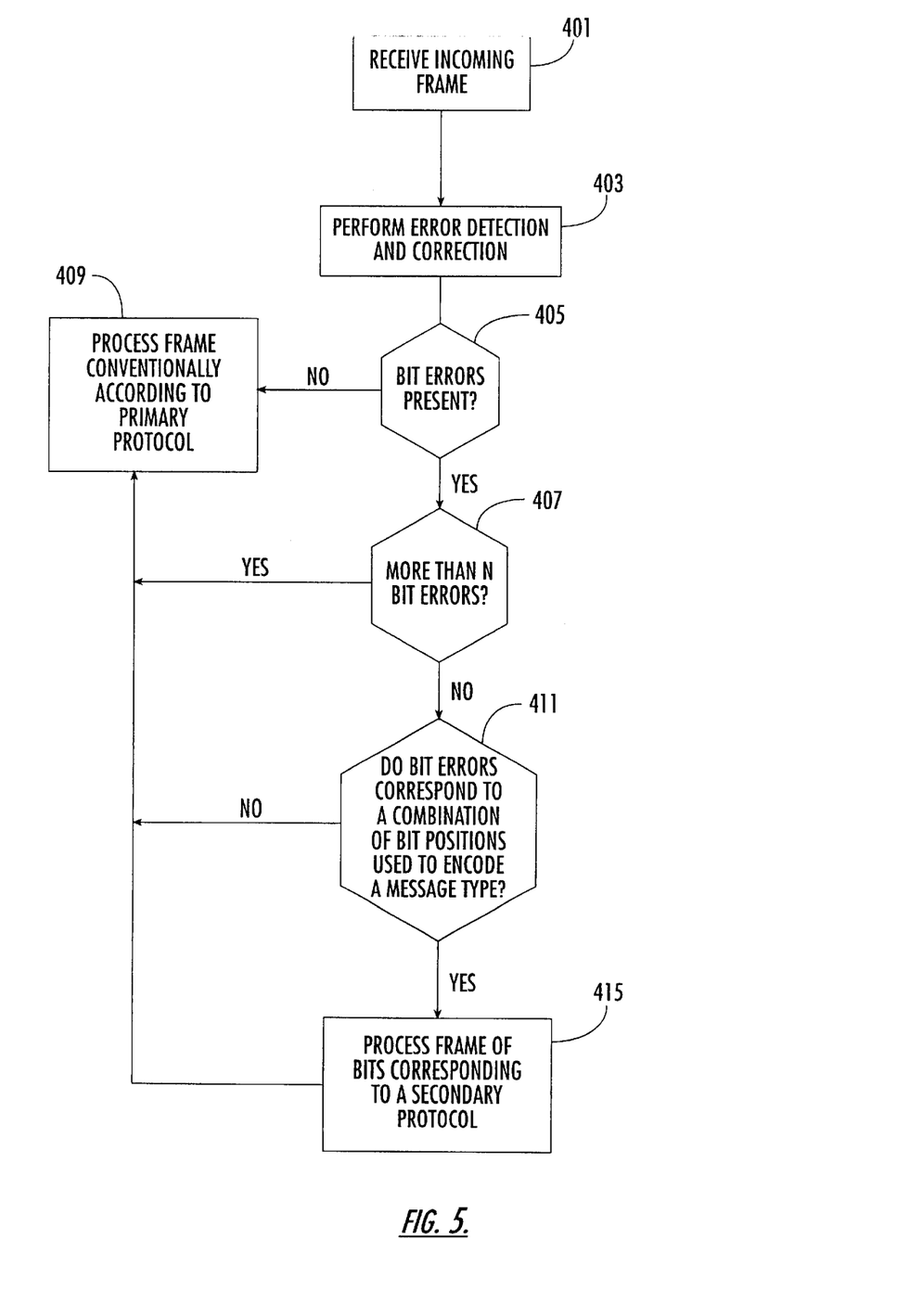
FIG. 5 is a flow diagram illustrating operations of a receiving communications node according to the present invention.

Referring now to the flowchart illustrations of FIGS. 3 and 5, the first communications node 21 receives the frame of bits from the first mobile terminal at block 301, and performs error detection and correction for the frame using the error-correcting code 49 at block 303. The first communications node then re-assembles the frame at block 305 correcting any bit errors detected during the step of performing error detection and correction for the frame. At block 307, the first communications node 21 determines if a second data signal should be transmitted from the system management node 35 to the system management node 37. If there is no second data signal 135 to be transmitted, the first communications node 21 transmits the frame on the communications channel 25 at block 309.

If there is a second data signal from the system management node 35 to be transmitted, the second data signal is encoded on the frame as shown in blocks 311, 312, and 315. In particular, the data to be transmitted in the second data signal is received from the system management node 35 where the second data signal 135 can include one of a plurality of message types. For example, each of the message types may represent a respective instruction to be transmitted from the system management node 35 to the system management node 37. Alternately, each of the message types may represent a different bit combination to be transmitted from the system management node 35 to the system management node 37. As an example, the second data signal may include one of four possible message types respectively representing the following two bit combinations: "00" (message type 0), "01" (message type 1), "10" (message type 2), and "11" (message type 3). Accordingly, the second data signal can be used to provide a relatively low data rate communications link between the system management nodes. Furthermore, a greater number of message types can be used to provide a greater number of instructions and/or a greater data rate for the second data signal 135.

At least one bit position of the frame and fewer that N bit positions of the frame can be assigned to each of the message types that can be transmitted using the second data signal. If four message types are provided representing the two bit combinations discussed above, a different combination of bit positions is assigned to each of the message types to allow encoding on the frame of data including the first data signal. For example, the frame 40 may include 100 bits and the error-correcting code may provide capacity to correct up to 5 bit errors (i.e. N=5). In this example, each combination of bit positions representing a different message type can include as many as 4 bit positions leaving capacity to correct one bit error incurred during subsequent transmission/reception, or as few as 1 bit position leaving capacity to correct up to 4 bit errors incurred during subsequent transmission/reception. By providing a message type defined by only one frame bit position, however, a single bit error may be misinterpreted as the transmission of a message using the second data signal.

As an example, each message type can be defined by a combination of two bit positions of the frame, wherein the combination of frame bit positions 75 and 80 is assigned to message type 0 ("00"), the combination of frame bit positions 76 and 81 is assigned to message type 1 ("01"), the combination of frame bit positions 77 and 82 is assigned to message type 2 ("10"), and the combination of frame bit positions 78 and 83 is assigned to message type 3 ("11"). With an error-correcting code having capacity to correct 5 bit errors (i.e. N=5), the second data signal can be transmitted with the first data signal over the communications channel 25 with the ability to correct up to 3 bit errors incurred during subsequent transmission/reception. In addition, bit errors incurred during transmission/reception must occur in two specific frame bit positions to be misinterpreted as a message type being sent using the second data signal. As discussed above, increasing the number of frame bit positions assigned to each message type can further reduce the possibility of misinterpreting a transmission bit error as a message type being sent using the second data signal.

Upon receipt of the message type to be sent using the second data signals, the communications node 21 determines the combination of bit positions assigned to the message type to be transmitted at block 312. According to the example provided above, a combination of frame bit positions 75 and 80 is assigned to the message type 0 ("00") so that the communications node 21 inverts bit positions 75 and 80 of the frame of bits including the first data signal at block 315 thus encoding the second data signal on the frame of bits including the first data signal. The frame including the intentionally inverted bits is then transmitted on the communications channel 25 at block 309 so that both the first and second data signals can be retrieved at the second communications node 23 using the excess capacity of the error-correcting code over the communications channel 25.

Figure 4A:
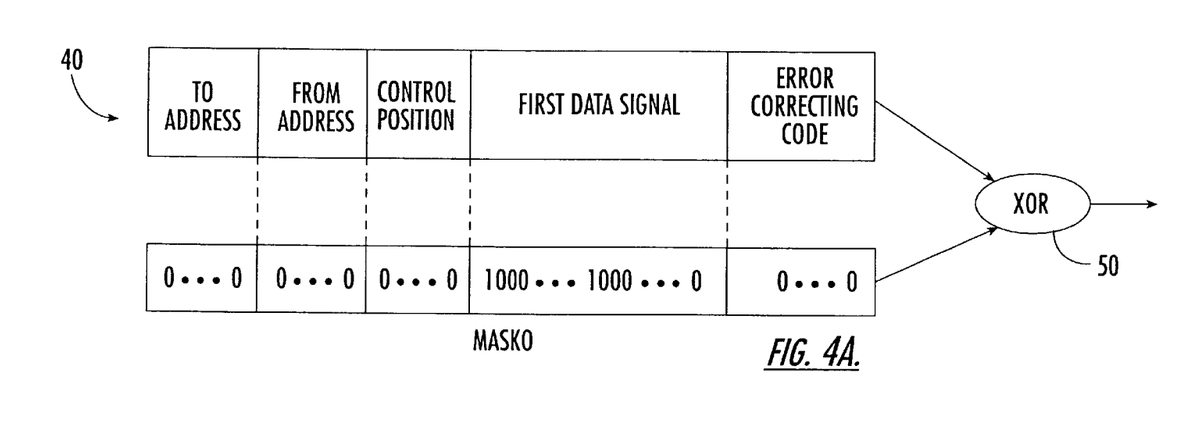
FIGS. 4A–4D are diagrams of masks corresponding to respective message types according to the present invention.
Figure 4B:
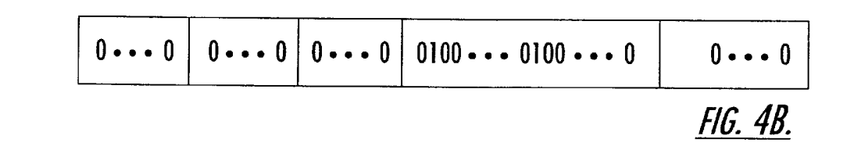
Figure 4C:
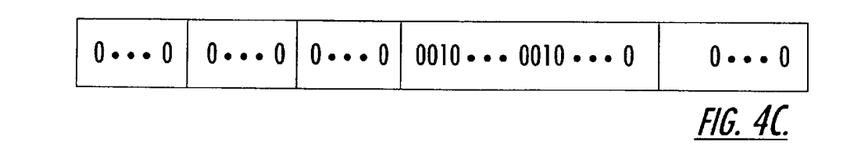
Figure 4D:
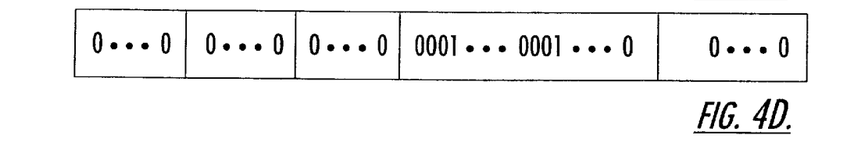

A technique for encoding message types of the second data signal on the frame of bits is illustrated in FIG. 4A. In particular, a different mask is assigned to each message type where each mask defines a different combination of frame bit positions to be inverted, and the appropriate mask can be combined with the frame of bits including the first data signal using an exclusive-OR function 50 as shown in FIG. 4. According to the example discussed above, MASK0 can be assigned to message type 0 where logic value "1" is stored in bit positions 75 and 80, and logical value "0" is stored in all other bit positions. When MASK0 is exclusive-ORed with the frame of bits including the first data signal, bit positions 75 and 80 of the frame of bits are inverted thereby encoding message type 0 of the second data signal on the frame of bits including the first data signal. Masks for message types 1, 2, and 3 are respectively illustrated in FIGS. 4B, 4C, and 4D according to the example discussed above.

As shown in the examples discussed above, the bit positions inverted to encode a message type of the second data signal are preferably separated to reduce the possibility that a burst error during transmission causes an inversion of bits that could be misinterpreted as a second data signal message type. While a separation of 5 bits is provided in the example discussed above, greater separation may be desirable. Alternately, a combination of adjacent bits could be provided in a mask for a second data signal message type, but this arrangement may be more susceptible to misinterpretation caused by burst errors during transmission. While the inverted bit positions for the message types are illustrated as being in the "First Data Signal" portion 47 of the frame, the inverted bit positions could be provided in other portions of the frame.

Referring now to the flowchart illustration of FIG. 5, the second communications node 23 then receives the frame of bits 40 transmitted over the communications channel 25 by the first communications node 21, and performs error detection and correction using the error-correcting code at blocks 401 and 403. Error detection and correction is performed at block 403 to detect and correct both bit errors intentionally induced to transmit a message type of the second data signal and bit errors incurred during transmission/reception. If no bit errors are present at block 405 or if more than N bit errors (where N is the maximum number of bit errors that can be corrected using the error-correcting code) are present at block 407, the second communication node 23 processes the received frame of bits conventionally according to the primary protocol at block 409. If N or fewer bit errors are detected at blocks 403, 405, and 407, the second communications node 23 determines if the positions of the bit error(s) correspond to bit positions used to encode a message type of the second data signal at block 411. As will be understood, the error-correcting code can provide error detection and correction as well as bit positions within the frame for errors detected and corrected.

If positions of the bit error(s) within the frame do not correspond to a combination of bit positions used to encode a message type or the second data signal at block 411, the second communications node 23 processes the frame conventionally according to the primary protocol at block 409. In particular, the second communications node 23 transmits the frame of bits to the second mobile terminal 33 after performing error detection and correction and without extracting and providing a second data signal to the system management node 37.

If the bit error(s) do correspond to a combination of bit positions used to encode a message type of the second data signal at block 411, the second. communications node 23 processes the frame of bits according to a secondary protocol at block 415 to regenerate the frame of bits including the "First Data Signal" (as originally provided by the first mobile terminal 27 to the first communications node 21) for transmission to the second mobile terminal 33, and to generate the second data signal for the system management node 37. In particular, the second communications node 23 corrects the intentionally inverted bit position(s) as well as any other detected and correctable bit errors (i.e. bits inverted during transmission/reception) to regenerate the frame of bits for transmission to the second mobile terminal 33. The second communications node 23 also uses the error-correcting code to identify intentionally inverted bit positions (i.e. those which correspond to a combination of bit positions used to encode a message type of the second data signal), identify the associated message type, and provide the message type to the system management node 37 as the received second data signal 135'.

In summary, a communications system according to the present invention uses excess capacity of an error-correcting code to provide a second data signal between two communications nodes. In the examples discussed above, an error-correcting code provides sufficient capacity with respect to a bit error rate expected over a wireless communication link between a mobile terminal and a base station. This error-correcting code may thus provide an excess error-correcting capacity with respect to a lower bit error rate expected over a communications channel between two communications nodes such as two radiotelephone base stations. Accordingly, the excess error-correcting capacity can be used to provide the second data signal between the two communications nodes such as the two radiotelephone base stations.

According to a further aspect of the present invention, the second data signal can be suppressed when a detected bit error rate between the two communications nodes 21 and 23 over communications channel 25 exceeds a predetermined threshold. For example, the second communications node 23 of FIG. 1 can determine a bit error rate for information received from the first communication node 21, and the transmission of the second data signal from the first communications node 21 to the second communications node 23 can be suppressed if the determined bit error rate exceeds a predetermined value. The full capacity of the error-correcting code can thus be applied to correction of bit errors incurred during transmission/reception of the frame of bits including the first data signal.

In particular, a suppression signal can be transmitted from the second communications node 23 to the first communications node 21 when the determined bit error rate exceeds the predetermined threshold signaling the first communications node 21 to suppress the second data signal, and a resume signal can be transmitted from the second communications node 23 to the first communications node 21 when the determined bit error rate drops below the predetermined threshold signaling the first communications node 21 to resume the second data signal. Periodic reports indicating a bit error rate below the predetermined threshold could alternately be sent from the second communications node 23 to the first communications node 21, with the absence of the periodic report being used to indicate a bit error rate below the predetermined threshold.

Alternately, it may be relatively accurate to assume that the forward bit error rate (from the first communications node 21 to the second communications node 23) and reverse bit error rate (from the second communications node 23 to the first communications node 21) are symmetric. In this situation, the first communications node 21 can determine a reverse bit error rate for information received from the second communications node 23 and suppress forward transmission of the second data signal to the second communications node 23 when the determined bit error rate exceeds the predetermined threshold.

As will be appreciated by those of skill in this art, the above-described aspects of the present invention may be provided by hardware, software, or a combination of the above. While various components of the communications nodes have been illustrated, in part, as discrete elements, they may, in practice, be implemented using a processor, such as a microcontroller, including input and output ports and running software code, by custom or hybrid chips, by discrete components or by a combination of the above. For example, the controller 61 may be contained within a processor (not shown) supporting other functions of the communications node.

Operations of the present invention have been described above with reference to the flow chart and schematic block diagrams of FIGS. 1–5. It will be understood that each block of the flowchart illustrations and/or block diagrams and combinations of blocks in the flowchart illustrations and/or block diagrams, can be implemented by computer program instructions. These program instructions may be provided to a processor to produce a machine, such that the instructions which execute on the processor create means for implementing the functions specified in the flowchart and/or block diagram block or blocks. The computer program instructions may be executed by a processor to cause a series of operational steps to be performed by the processor to produce a computer implemented process such that the instructions which execute on the processor provide steps for implementing the functions specified in the flowchart and/or block diagram block or blocks.

Accordingly, blocks of the flowchart illustrations and block diagrams support combinations of means for performing the specified functions, combinations of steps for performing the specified functions and program instruction means for performing the specified functions. It will also be understood that each block of the flowchart illustrations and/or block diagrams, and combinations of blocks in the flowchart illustrations and/or block diagrams, can be implemented by special purpose hardware-based systems which perform the specified functions or steps, or combinations of special purpose hardware and computer instructions.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A method for transmitting first and second data signals, said method comprising the steps of:
   providing a frame of bits including a first plurality of bits defining the first data signal and a second plurality of bits defining an error-correcting code having capacity to correct N bit errors in the frame;
   associating at least one bit position but less than N bit positions of the frame with a message type of the second data signal;
   intentionally inverting the at least one associated bit position of the frame to encode the message type of the second data signal in the frame of bits; and
   after intentionally inverting the at least one associated bit position of the frame to encode the message type of the second data signal in the frame of bits, transmitting the encoded frame of bits;
   receiving the encoded frame of bits with the at least one intentionally inverted associated bit position and with an additional unintentionally inverted bit position;
   performing error correction on the received encoded frame of bits using the error-correcting code to decode the at least one associated bit position to recreate the first Plurality of bits defining the first data signal and to correct the additional unintentionally inverted bit position; and
   determining the message type based on the at least one decoded associated bit position to receive the second data signal including the message type.

2. A method according to claim 1 wherein the step of associating comprises associating a plurality of combinations of at least one bit position with a respective plurality of message types of the second data signal, and selecting one of the plurality of associated combinations of at least one bit position representing one of the message types, wherein the step of inverting the at least one associated bit position comprises inverting the selected associated combination of at least one bit position.

3. A method according to claim 1 wherein the step of transmitting the encoded frame of bits comprises transmitting the encoded frame of bits over a wired communications link, and wherein the step of receiving the encoded frame of bits comprises receiving the encoded frame of bits over the wired communications link.

4. A method according to claim 1 wherein the step of providing the frame of bits comprises receiving the frame of bits over a wireless communication link, and wherein the step of transmitting the encoded frame of bits comprises transmitting the encoded frame of bits over a wired communications link.

5. A method according to claim 1 wherein the step of associating comprises associating a plurality of spaced apart bit positions with the message type so that intentionally inverting the at least one associated bit position comprises intentionally inverting the plurality of spaced apart bit positions.

6. A method according to claim 1 wherein the encoded frame of bits is transmitted from a first node and wherein the encoded frame of bits is received at a second node, the method further comprising the steps of:
   determining a bit error rate (BER) for information received at the second node from the first node; and
   suppressing transmission of the second data signal from the first node to the second node when the bit error rate exceeds a predetermined threshold.

7. A method according to claim 6 further comprising:
   maintaining transmitting the encoded frame of bits while suppressing transmission of the second data signal.

8. A method according to claim 1 wherein the encloded frame of bits is transmitted from a first node and wherein the encoded frame of bits is received at a second node, the method further comprising the steps of:
   determining a bit error rate (BER) for information received at the first node from the second node; and
   suppressing transmission of the second data signal from the first node to the second node when the bit error rate exceeds a predetermined threshold.

9. A method according to claim 8 further comprising:
   maintaining transmitting the encoded frame of bits while suppressing transmission of the second data signal.

10. A communications system that transmits first and second data signals comprising:
    a first communications node that provides a frame of bits including a first plurality of bits defining the first data signal and a second plurality of bits defining an error-correcting code having capacity to correct N bit errors in the frame,
    an encoder that associates at least one bit position but less than N bit positions of the frame with a message type of the second data signal, and that intentionally inverts the at least one associated bit position of the frame to encode the message type of the second data signal in the frame of bits; and
    a transmitter that transmits the encoded frame of bits after the at least one associated bit position of the frame has been intentionally inverted to encode the message type of the second data signal in the frame of bits;
    a receiver that receives the encoded frame of bits with the intentionally inverted at least one associated bit position and with an additional unintentionally inverted bit position; and
    a decoder that performs error correction on the received encoded frame of bits using the error-correcting code to decode the at least one associated bit position to recreate the first plurality of bits defining the first data signal, and that determines the message type based on the at least one decoded associated bit position to receive the second data signal including the message type, and wherein the decoder corrects the additional unintentionally inverted bit position.

11. A communications system according to claim 10 wherein the encoder defines a plurality of associated bit positions representing a respective plurality of message types of the second data signal, and wherein the encoder selects one of the plurality of associated bit positions representing one of the message types, and wherein the encoder inverts the selected of the plurality of associated bit positions.

12. A communications system according to claim 10 wherein the transmitter transmits the encoded frame of bits over a wired communications link, and wherein the receiver receives the encoded frame of bits over the wired communications link.

13. A communications system according to claim 10 wherein the first communications node receives the encoded frame of bits over a wireless communication link and wherein the transmitter transmits the encoded frame of bits over a wired communications link.

14. A communications system according to claim 10 wherein the encoder associates a plurality of spaced apart bit positions with the message type so that the encoder intentionally inverts the plurality of spaced apart bit positions.

15. A communications system according to claim 10 wherein the decoder determines a bit error rate (BER) for information received at the receiver from the transmitter, and wherein the encoder suppresses transmission of the second data signal when the bit error rate exceeds a predetermined threshold.

16. A communications system according to claim 15 wherein the encoder maintains transmission of the encoded frame of data bits while suppressing transmission of the second data signal.

17. A communications system according to claim 10 wherein the encoder determines a bit error rate (BER) for information received at the first communications node, and wherein the encoder suppresses transmission of the second data signal when the bit error rate exceeds a predetermined threshold.

18. A communications system according to claim 17 wherein the encoder maintains transmission of the encoded frame of data bits while suppressing transmission of the second data signal.

19. A method for receiving first and second data signals, said method comprising the steps of:

receiving a frame of bits including a first plurality of bits defining the first data signal and a second plurality of bits defining an error-correcting code having a capacity to correct N bit errors in the frame, wherein at least one bit position but less than N bit positions of the frame are associated with a message type of the second data signal, wherein the at least one associated bit position of the frame have been intentionally inverted prior to reception to encode the message type of the second data signal in the received frame of bits and wherein the frame of bits includes an additional unintentionally inverted bit position;

performing error correction on the received encoded frame of bits using the error-correcting code to decode the at least one associated bit position to recreate the first plurality of bits defining the first data signal and to correct the additional unintentionally inverted bit position; and determining the message type of the second data signal based on the at least one decoded associated bit position to receive the second data signal.

20. A method according to claim 19 wherein the step of receiving the frame of bits comprises receiving the frame of bits over a wired communications link.

21. A method according to claim 20 further comprising the step of:

transmitting the frame of bits including the first data signal and the error-correcting code over a wireless communications channel.

* * * * *